United States Patent [19]

McClanahan et al.

[11] Patent Number: 4,709,215

[45] Date of Patent: Nov. 24, 1987

[54] TRAVELING WAVE TUBE DRIVE CONTROLLER

[75] Inventors: Robert F. McClanahan, Valencia; Robert Washburn, Malibu; William Hwang, Los Angeles, all of Calif.

[73] Assignee: Hughes Aircraft Company, Los Angeles, Calif.

[21] Appl. No.: 814,546

[22] Filed: Dec. 30, 1985

[51] Int. Cl.$^4$ .............................................. H03F 3/58
[52] U.S. Cl. ....................................... 330/43; 330/86; 330/112
[58] Field of Search .......................... 330/43, 86, 112; 331/82; 343/5 R

[56] References Cited

U.S. PATENT DOCUMENTS

| | | | |
|---|---|---|---|
| 3,173,108 | 3/1965 | Kawahashi et al. | 330/43 X |
| 3,668,533 | 6/1972 | Fish | 328/168 |
| 4,066,965 | 1/1978 | Schultz et al. | 330/43 X |

FOREIGN PATENT DOCUMENTS

WO86/00476 1/1986 PCT Int'l Appl. .
2060292 4/1981 United Kingdom .

OTHER PUBLICATIONS

IRE Transactions on Communications Systems, vol. CS-10, No. 1, Mar. 1962 (Professional Group on Communications Systems, New York, USA), V. C. Chewey, "Beam-Controlled Linear Klystron Amplifiers for Improved SSB Efficiency", pp. 142–145, see FIGS. 1, 2; p. 143, 1 paragraph: Principles of Klystron Beam Control. Patent Abstracts of Japan, vol. 2, No. 19, Feb. 8, 1978, p. 11115 E77 & JP, A, 52136546 (Nippon Denki K.K.) Nov. 15, 1977.

Primary Examiner—James B. Mullins
Attorney, Agent, or Firm—Robert Thompson; A. W. Karambelas

[57] ABSTRACT

A method and apparatus are disclosed for regulating the operation of a TWT. The TWT regulation is achieved by detecting the operating condition of the TWT, e.g., by measuring dynamic gain, and regulating feedback of the TWT output in response to the TWT operating condition. The invention is preferably implemented so as to augment the TWT input drive from an exciter source to induce the TWT to drive itself into saturation. The inventive technique comprises determining whether the TWT is operating in a desired operating condition, e.g., saturation, feeding back to the TWT input a portion of the TWT output power to the TWT input, and regulating the feedback signal to keep the TWT operating in the desired condition. Determination of whether the TWT is operating in a saturation condition may be affected through measurement of the TWT dynamic gain. The invention permits dynamic management of the feedback to accommodate variations in gain of the TWT, e.g., such as those during TWT input pulse rise and pulse fall times. The invention maintains the TWT in the desired condition despite changes in the condition of the TWT or in the signals applied to the TWT.

28 Claims, 8 Drawing Figures

TRAVELING WAVE TUBE DRIVE CONTROLLER

BACKGROUND OF THE INVENTION

The present invention relates to radar transmitters and, more particularly, to control circuits for regulating feedback from the output of the traveling wave tube so as to augment the radio frequency drive from the exciter source and induce the traveling wave tube to drive itself into saturation.

In a radar transmitter it is generally desirable to maintain the power output level of the radar interrogating signal constant, and as high as possible as the frequency of the interrogating signal is modulated. Thus, the amplitude of the return signal is not a time varying function related to the interrogating signal, but rather a function of the composition and movement of the area being interrogated. Attainment of constant high output power and low amplitude modulation noise levels, depend upon the traveling wave tube (TWT) being operated at saturation, i.e., at the highest output level that the TWT can deliver. The radio frequency drive level required to achieve saturation, in turn, depends upon many parameters that may vary on a dynamic basis. Those parameters include the instantaneous RF frequency, TWT power supply and control voltages, temperature, RF drive path losses, TWT variations from tube to tube, aging of the TWT, and localized magnetic fields.

In addition to dynamically varying parameters, the RF drive level required to achieve saturation also depends upon the output mode in which the TWT is operating. Contemporary dual mode radar systems operate at high and low output power levels in order to permit interrogation of local areas without generating a high level radar interrogation signal that can be readily intercepted at a distance. Because the TWT gain drops much faster than the TWT output power, the required input power to operate in low output power mode may be substantially greater than that required to operate in a high power mode. Therefore, contemporary TWT drive circuits for dual mode radar transmitters must incorporate an RF exciter source having sufficient output power to drive the TWT into saturation in the low output power mode. In order to achieve maximum useful life from the TWT, a control circuit should preferably compensate for variations in the above parameters so as to maintain the TWT in saturation.

Two types of control circuits are currently employed to maintain the TWT in saturation. The first type measures the TWT output power and utilizes feedback control to adjust the attenuation of the signal from the RF source which serves as the sole source of TWT input power. The second type calibrates and stores the proper RF drive level to saturate the TWT in each operating mode at system turn on, and then commands the appropriate level of attenuation of the signal from the RF source, which again is the sole TWT input.

In order to determine the appropriate attenuation level, contemporary feedback control circuits sense the output power of the TWT and adjust an attenuator in the TWT's RF drive line when the output power varies, e.g., in response to a change in the RF frequency. Because such contemporary feedback control circuits sense the average output power of the TWT and dither the feedback level to arrive at the optimum output power, those circuits are less sensitive to the TWT operations and result in the introduction of noise lines into the TWT input signal. The noise component of the TWT input signal causes irregulaties in the output power level which degrade the circuit's ability to maintain a constant output power level from the TWT. Moreover, control circuits that operate by variable attenuation of the RF source signal level requires a sufficiently high power level RF signal source to drive the TWT into saturation in any operating mode.

In general, the reaction time of TWT feedback control circuits is limited by the operating frequency of the TWT and time delays inherent in the TWT. More particularly, the feedback signal must arrive at the input of the TWT within a 90° phase angle variation of the exciter source signal. Otherwise, the feedback signal is too far out of phase with the exciter signal to exert required control and stabilizing influence. Because contemporary TWT's have inherent transmissions delays of approximately 20 nano seconds (20 ns), the feedback signal is a minimum of 20 ns behind the exciter signal. Assuming the limiting condition that the 20 nano second period represents 90° of the maximum RF input signal, the highest RF signal frequency at which a feedback control circuit could operate is approximately 12.5 MHz. Small delays resulting from implementation of calibration routines and power setting will further increase the minimum feedback time, and therefore reduce the highest RF frequency at which the system can operate. Moreover, as with contemporary feedback control circuits, such calibration circuits require control devices for rapidly adjusting the RF drive signal. Those devices can contribute substantially to the cost of the TWT circuit.

SUMMARY OF THE INVENTION

A method and apparatus are disclosed for regulating the operation of a TWT. The TWT regulation is achieved by detecting the operating condition of the TWT, e.g., by measuring dynamic gain, and regulating feedback of the TWT output in response to the TWT operating condition. The invention is preferably implemented so as to augment the TWT input drive from an exciter source to induce the TWT to drive itself into saturation. The inventive technique comprises determining whether the TWT is operating in a desired operating condition, e.g., saturation, feeding back to the TWT input a portion of the TWT output power to the TWT input, and regulating the feedback signal to keep the TWT operating in the desired condition. Determination of whether the TWT is operating in a saturation condition may be affected through measurement of the TWT dynamic gain. The invention permits dynamic management of the feedback to accommodate variations in gain of the TWT, e.g., such as those during TWT input pulse rise and pulse fall times. The invention maintains the TWT in the desired condition despite changes in the condition of the TWT or in the signals applied to the TWT.

DETAILED DESCRIPTION OF THE PREFERRED EMBODIMENT

OVERVIEW

The detailed description set forth below in connection with the appended drawings is intended merely as a description of the presently preferred embodiment of the invention, and is not intended to represent the only form in which the present invention may be constructed or utilized. The description sets forth the functions and sequence of events that are affected by the invention in connection with the illustrated embodiment. It is to be understood, however, that the same, or equivalent functions and sequences may be accomplished by different embodiments that are also intended to be encompassed within the spirit and scope of the invention.

As described below, the present invention permits TWT saturation to be automatically acquired on a pulse-to-pulse basis without external command or control. That capability reduces the amount of radar system software, saves storage space in the system computer memory, and reduces the amount of inter-unit communication required to control the system.

The present invention also permits reduction of the exciter output power levels and relaxation of thermal variation requirements because the TWT can provide the majority of the RF drive and automatically compensates for changes in RF drive levels.

Aside from simplification of the control circuitry, and reduction of required exciter levels, the present invention also permits simplification of the TWT design. For example, a typical airborne radar coupled cavity TWT has a gain of 50 to 56 dB which necessitates a 3-section slow wave structure. With the added drive power attributable to the positive feedback circuit, the required gain of the TWT can be reduced to 35 dB or less. That reduction in required gain permits elimination of one section of the slow wave structure and reduction of the number of cavities in the remaining sections of the TWT. The simplified TWT is less susceptible to drive induced oscillations, exhibits lower noise characteristics and has a shorter transmission delay permitting greater responsiveness in the feedback control loop. The present invention therefore results in a TWT circuit that can be significantly smaller, lighter and less expensive than contemporary TWT circuits, while providing improved performance for the radar system.

The present invention achieves the foregoing advantages through utilization of gain regulated positive feedback from the TWT output to augment the RF drive. The TWT thus drives itself into saturation without the requirement for an exciter to provide high RF drive levels. Accordingly, solid state RF sources can be used to provide the RF drive signal.

The circuit compares the input and output of the traveling wave tube, and utilizes the resulting gain indication to control an attenuator circuit in the feedback loop. The attenuator controls the feedback power level to the TWT. In order to provide non-oscillating TWT drive augmentation, the present invention controls the positive feedback level, such that the feedback loop gain is kept slightly below unity at all drive levels and frequencies. Under those conditions, the TWT can self-saturate on a pulse-to-pulse basis.

In order to accommodate dynamic gain variations resulting from pulse patterns, the present invention adjusts the positive feedback on a dynamic basis in response to instantaneous gain variations so as to track the pulse patterns. During each pulse as TWT output power increases, TWT gain begins to decrease. The gain control circuit automatically increases the power feedback level during the pulse rise, thereby providing sufficient RF drive to saturate the TWT. During the trailing edge of the pulse, as output power drops and TWT gain increases, the feedback power level is correspondingly decreased to maintain a non-oscillating condition.

Because several cyles to the loop are frequently required to raise the drive signal to the level required to saturate the TWT, the TWT output curve is stepped in response to incremental changes in the positive feedback signal. In the presently preferred embodiment, the TWT output signal consists of amplitude steps with 100 ps transition times occurring at 22 ns intervals, the intervals being dependent upon the loop transit time.

General Circuit Description

Figure 1:
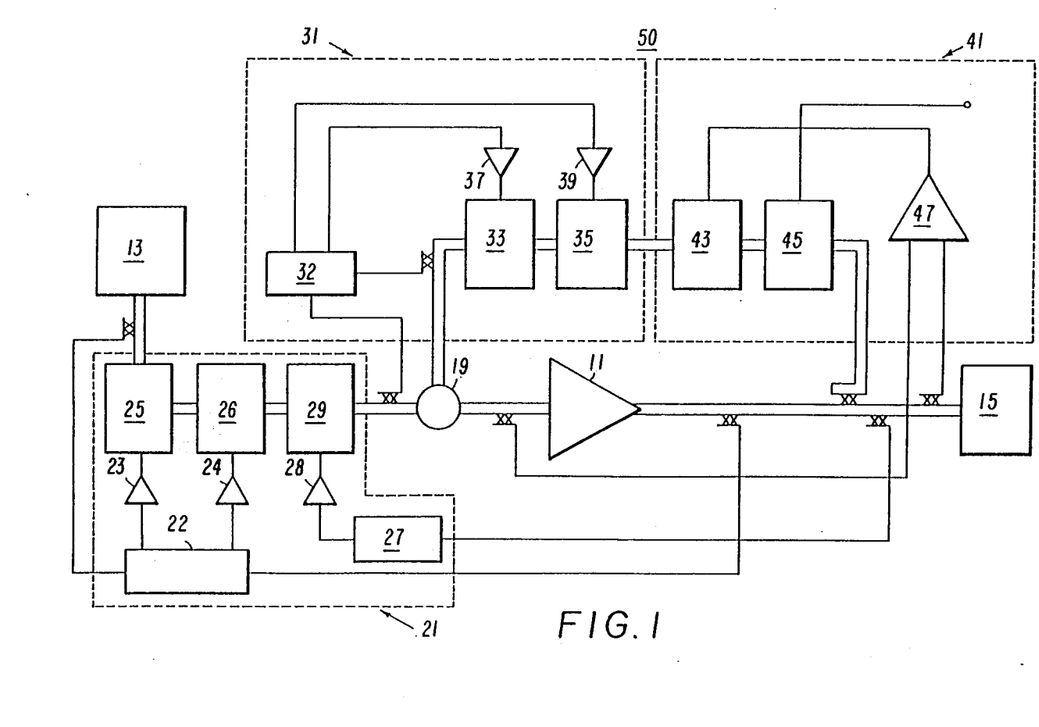
FIG. 1 is a schematic drawing of an exemplary TWT drive control circuit incorporating the present invention.

Referring to FIG. 1 of the drawings, an overall circuit diagram is illustrated therein for controlling the operation of TWT 11. In general, a signal from the RF source 13 is communicated to power combiner 19 to drive the TWT 11. The output from TWT 11 is then communicated to transmitter 15 where it is broadcast as an interrogating radar signal.

In practice, the RF source 13 may be any of a number of commercially available units such as Varian VSX 9001 VQ gain diode oscillator. TWT 11 may also be any of a number of commercially available units such as Hughes Aircraft Co. 790H. It is anticipated, however, that a lower gain TWT may be utilized in conjunction with the present invention, e.g., on the order of 10-15 dB below that otherwise required for the same application.

Noise control circuit 21 illustrated in more detail at FIGS. 2, 3, 4a and 4b may utilize any of a number of commercially available designs adapted to condition the signal from the RF source 13 by means of negative feedback from the output of TWT 11. The noise control circuit 21 opposes noise in the signal to TWT 11 attributable to spurious phase or amplitude modulation.

In the presently preferred embodiment, noise control circuit 21 includes phase modulation detector 22, connected to the RF source 13 and the output of TWT 11. Phase modulation detector 22 is described more fully in connection with FIG. 2. When the RF source and TWT output signals are out of phase, the phase modulation detector 22 generates a difference signal to controllers 23 and 24, that in turn regulates the operation of digital phase shifter 25 and analog phase shifter 26. Both digital phase shifter 25 and analog phase shifter 26 are adapted to vary the phase of the signal communicated from the RF source 13 to the TWT 11, such that the output of the TWT 11 is some whole integer times 360° the phase of the signal from the RF source 13, i.e., the signal from the RF source 13 and the output from TWT 11 are effectively phase locked. Controller 23 may comprise emitter coupled logic intergrated circuits such as the 1650 and the 1674, and either a model 0104 or 1662 and 1688, for the AND functions. Controller 24 may be comprised of a LH0032 amplifier, a LH0033 buffer, and a shotsky diode such as HD1006. Digital phase shifter 25 is preferably adapted to provide course phase adjustments and analog phase shifter 26 provides more finely tuned phase adjustments within the incremental region to which digital phase shifter 25 corrects. In the presently preferred embodiment, phase detector 22 may comprise commercially available devices such as in phase and quadrature power splitters with double balanced mixers such as Watkins & Johnson, model M31A. Digital phase shifter 25 may be implemented as a Planar Microwave PCA0025 model and analog phase shifter 26 may be implemented as a Triangle PQ1151 model.

Figure 3:
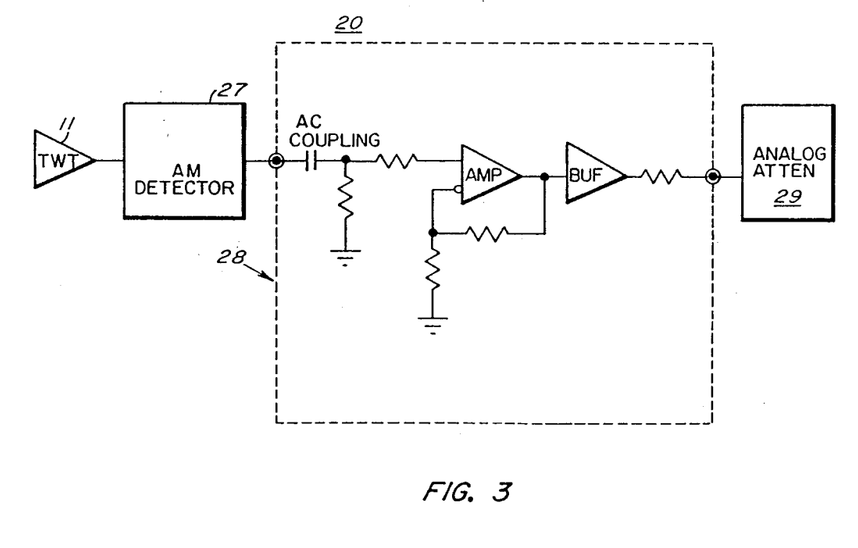
FIG. 3 is a schematic diagram of the amplitude modulation control circuit of FIG. 1.

Amplitude modulation noise control circuit 20, shown at FIG. 3, includes detector 27 and controller 28. Noise circuit 20 forms a portion of noise control circuit 21, and is also connected to the input and output of the TWT 11. Upon detection of variations in the signal amplitude output from TWT 11, the AM detector 27 communicates a signal to controller 28 that regulates the operation of analog attenuator 29, to increase or decrease the attenuation of the signal from the RF source 13 to the TWT 11, i.e., the TWT input signal. Detector 27, controller 28 and analog attenuator 29 operate as a negative feedback circuit adapted to oppose amplitude modulation of the signal from RF source 13 by selective introduction of an opposing, out of phase signal derived from the output of the TWT 11. In the presently preferred embodiment, AM detector 27 may be implemented as an Omni Spectra model 2086-6000-013, controller 28 may be implemented in the same manner as controller 24, and analog attenuator 29 may be implemented as an Anaran 60368 model.

Despite the attenuation and phase correction affected by noise control circuit 21, the TWT 11 may be induced to operate outside of the saturation region as a consequence of factors such as rapid frequency modulation of the RF source, changes in the grid voltage to the TWT 11, pulsing of the output load, etc. In order to correct for such variations in the operation of the TWT 11, a compensation circuit 50 is provided across the input and the output of the TWT 11.

Figure 5:
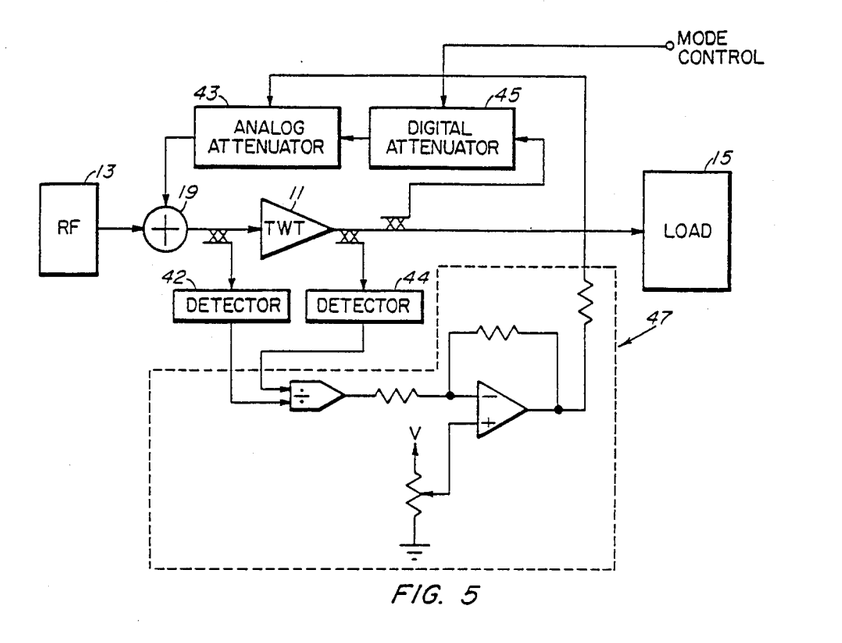
FIG. 5 is a schematic representation of the TWT feedback attenuation control circuit of FIG. 1.

The compensation circuit 50, described in more detail in connection with FIGS. 5 and 7, is implemented as an attenuation control circuit 41 and phase control circuit 31. Attenuation control circuit 41 includes analog attenuator 43, digital attenuator 45 and attenuator control 47. In general, the attenuation control circuit 41 operates to tap a portion of the output power from the TWT 11, which is then fed back to power combiner 13 at the input to TWT 11 to effect gain regulated positive feedback to drive the TWT into saturation. The attenuation control circuit 41 selectively varies the amplitude of the feedback signal so as to maintain the TWT 11 in a saturated operating condition despite variations in the input to TWT 11 from the RF source variations in the control grid voltage of TWT 11, or other transient conditions. Mode control connector 49 is connected to an external switching circuit and is adapted to effect substantial variations in the attenuation of the positive feedback signal through digital attenuator 45 to compensate for substantially simultaneous changes effected when the TWT 11 is to be operated in a different mode, e.g., changes in the applied grid voltage to TWT 11 and the amplitude of the signal from RF source 13.

Noise Reduction Circuit

Figure 2:
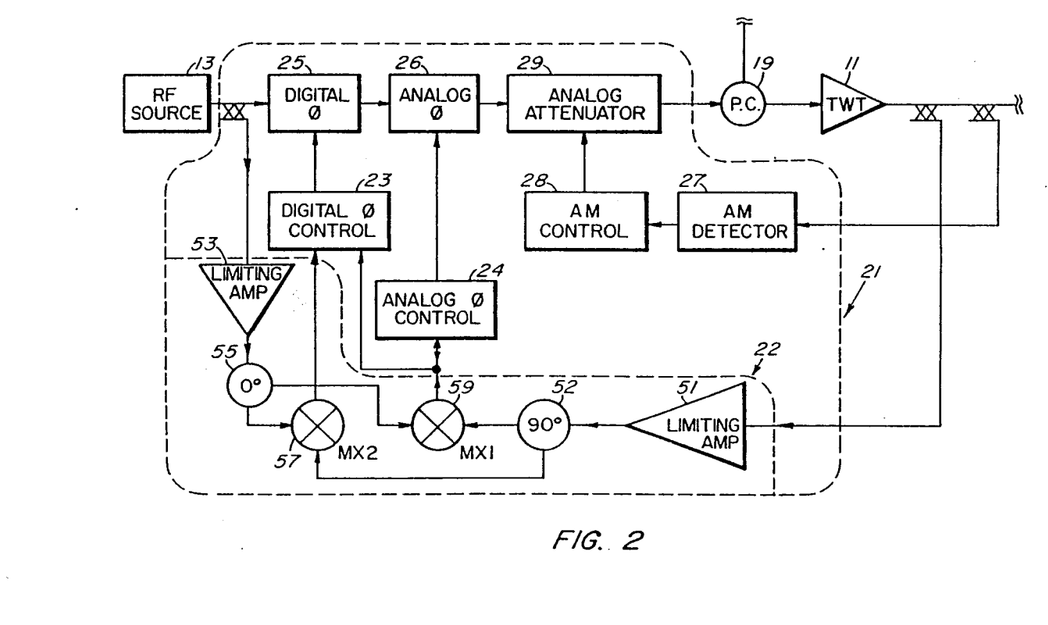
FIG. 2 is a schematic diagram of a portion of the circuitry of FIG. 1, further detailing the noise control circuitry.

FIG. 2 illustrates a portion of the circuit illustrated in FIG. 1, with further detail provided of an exemplary noise control circuit 21, particularly phase modulation detector 22. The noise reduction circuit 21 is comprised of power splitters and mixers for phase detection, limiting amplifiers to detect only the phase difference independent of the amplitude of the signal, analog and digital phase shifters for effecting the variable phase shift, and control electronics for regulating the operation of the phase shifters in response to the mixers outputs.

FIG. 2 illustrates the circuit elements and their innerconnections. The input and output of the TWT 11 are sampled, then go through optional limiting amplifiers 53 and 51, respectively, for insuring a constant amplitude signal and then split in two signals. The sampled input power is split by the in phase power splitter 55. While the sampled output power is shifted 90° by off phase power splitter 52.

As shown at FIG. 2, the output of TWT 11 is detected and the detection signal is communicated to limiting amplifier 51. The output of limiting amplifier 51 is phase shifted 90° by off phase power splitter 52. The output of off phase power splitter 52 is communicated to mixers 57 and 59 and is compared to the output of RF source 13. The output of RF source 13 is communicated to mixers 57 and 59 via limiting amplifier 53 and in phase power splitter 55. The comparison between the signal from RF source 13 and the 90° phase shifted signal from the output of off phase power splitter 52 is operative to generate signals that serve as inputs to digital phase controller 23, shown in more detail at FIG. 4A, and analog phase controller 24, shown in more detail at FIG. 4B. Digital phase controller 23 and analog phase controller 24 in turn control the operation of digital phase shifter 25 and analog phase shifter 26, respectively.

Because one of inputs to mixers 57 and 59 is 90° phase shifted, it becomes relatively simple to determine the variation of mixer voltage, resulting from the amount of phase difference between the TWT input and output voltages.

Generally, the output voltage of the mixers can be written as:

Vif = V cos ($\phi$ + T$_1$),
Vif = mixer output voltage
V = constant and
$\phi$ = phase difference between the mixed signals at identical frequencies and constant amplitude.

The relationship between the voltage at the inputs to digital phase controller 23 and the phase difference is set forth in Table I, where V$_{1F1}$ = signal derived from output of mixer 59, and V$_{IF2}$ = signal derived from output of mixer 57.

TABLE I

| Phase Difference (O) In Degrees | Mixer Output Voltage Polarity | |
| --- | --- | --- |
| 0 < $\phi$ 90 | V$_{IF1}$ < $\phi$ | V$_{IF2}$ < $\phi$ |
| 90 < $\phi$ < 180 | V$_{IF1}$ > $\phi$ | V$_{IF2}$ < $\phi$ |
| 180 < $\phi$ < 360 | V$_{IF1}$ > $\phi$ | V$_{IF2}$ > $\phi$ |
| 270 < $\phi$ < 360 | V$_{IF1}$ < $\phi$ | V$_{IF2}$ > $\phi$ |

Knowing the relationship between the phase difference and the mixer output voltage, the phase shift between TWT input and output voltages may be determined by examining the polarity of the output voltages from mixers 57 and 59. For example, if $V_{IF1}$ and $V_{IF2}$ are both negative, the phase difference between TWT input and output signals is between 0° and 90°, and the amount of phase shift needed is between 270° and 360°. In such a case, a course phase shift of 270° can safely be made independent of the precise phase difference.

The relationship between the polarity of the signals $V_{IF1}$ and $V_{IF2}$, from mixers 57 and 59, in comparison to the phase shift needed, is set forth in Table II. Referring to Table II, a "1" is used to indicate a positive voltage, and a "0" is used to indicate a negative voltage.

TABLE II

| Phase Shift Needed | Min. Phase Shift | $V_{IF1}$ | $V_{IF2}$ |
|---|---|---|---|
| 270 < φ < 360 | 270 | 0 | 0 |
| 180 < φ < 270 | 180 | 1 | 0 |
| 90 < φ < 180 | 90 | 1 | 1 |
| 0 < φ < 90 | 0 | 0 | 1 |

Figure 4A:
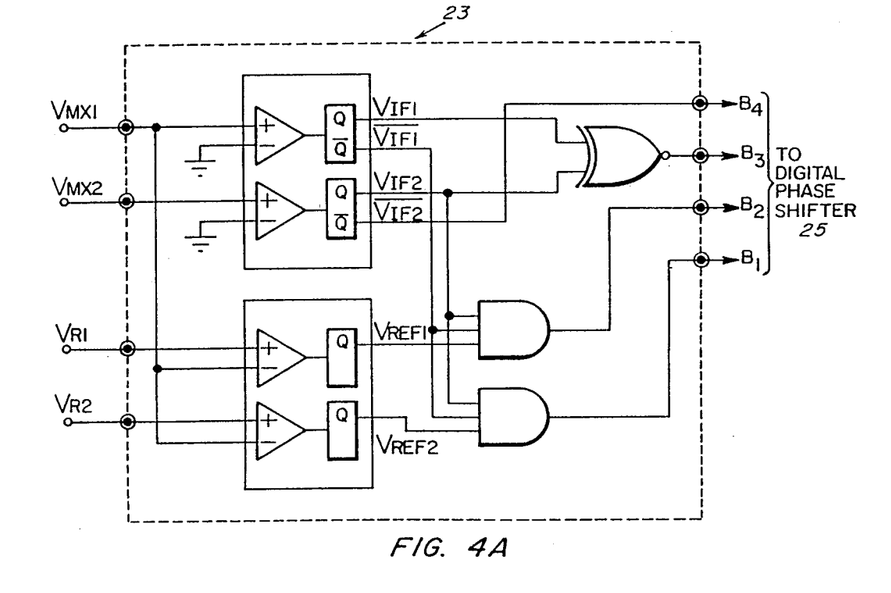
FIG. 4a is a logic diagram of the digital phase shifter control circuit of FIG. 1.

Thus, $V_{IF1}$ and $V_{IF2}$, derived from the outputs from mixers 59 and 57, can be used to control the digital phase controller 23 and digital phase shifter 25. Digital phase controller 23, illustrated in more detail at FIG. 4A, compares the two inputs from mixers 57 and 59, and determines within 90°, what the phase difference is between the signal from RF source 13 and the output from TWT 11. In practice, the digital phase shifter 25 has four bit control and the bits for 90° and 180° are controlled by $V_{IF1}$ and $V_{IF2}$. $V_{REF1}$ and $V_{REF2}$ control the 45° and 22.5° bits to further lock the phase shift within 22.5°. This phase lockup happens when the $V_{IF1}=0$ and $V_{IF2}=1$ and only at this time, see Table II, line 4. After this, the analog phase shifter will correct for the remainder of the phase shift needed.

FIG. 4a illustrates an exemplary construction of digital phase controller 23. The inputs to controller 23 include $V_{MX1}$ and $V_{MX2}$, the outputs from mixers 59 and 57 respectively, as well as $V_{R1}$ and $V_{R2}$, reference voltages that are provided external to digital controller 23. In practice, $V_{R1}$ and $V_{R2}$ are sinasoidal signals 22.5° out of phase. A truth table showing the outputs of digital phase controller 23 in response to the various inputs is set forth in Table III.

TABLE III

| $V_{IF1}$ | $V_{IF2}$ | $V_{REF1}$ | $V_{REF2}$ | B4 (180°) | B3 (90°) | B2 (45°) | B1 (22.5°) |
|---|---|---|---|---|---|---|---|
| 0 | 0 | 0 | 0 | 1 | 1 | 0 | 0 |
| 1 | 0 | 0 | 0 | 1 | 0 | 0 | 0 |
| 1 | 1 | 0 | 0 | 0 | 1 | 0 | 0 |
| 0 | 1 | 0 | 0 | 0 | 0 | 0 | 0 |
| 0 | 1 | 0 | 1 | 0 | 0 | 0 | 1 |
| 0 | 1 | 1 | 1 | 0 | 0 | 1 | 1 |
| 0 | 1 | 1 | 0 | 0 | 0 | 1 | 0 |

According to Table III, the following logic functions can be obtained for the four bit control signals communicated from digital phase controller 23 to digital phase shifter 25.

$B_4 = \overline{V_{IF2}}$   $B_2 = \overline{V_{IF1}} V_{IF2} V_{REF1}$ $B_3 = \overline{V_{IF1} + V_{IF2}}$   $B_1 = \overline{V_{IF1}} V_{IF2} V_{REF2}$ Analog phase shifter 26 may typically have a dynamic range of approximately 90°, but may be constructed to have only a 22.5° range, or less, in view of the function of the digital phase shifter 25. The more limited operating range is permitted because the phase shift can be reduced to within 22.5° by the digital phase shifter 25, leaving the analog phase shifter 26 to fine tune the phase shift of the input signal further beyond the 22.5° resolution.

Figure 4B:
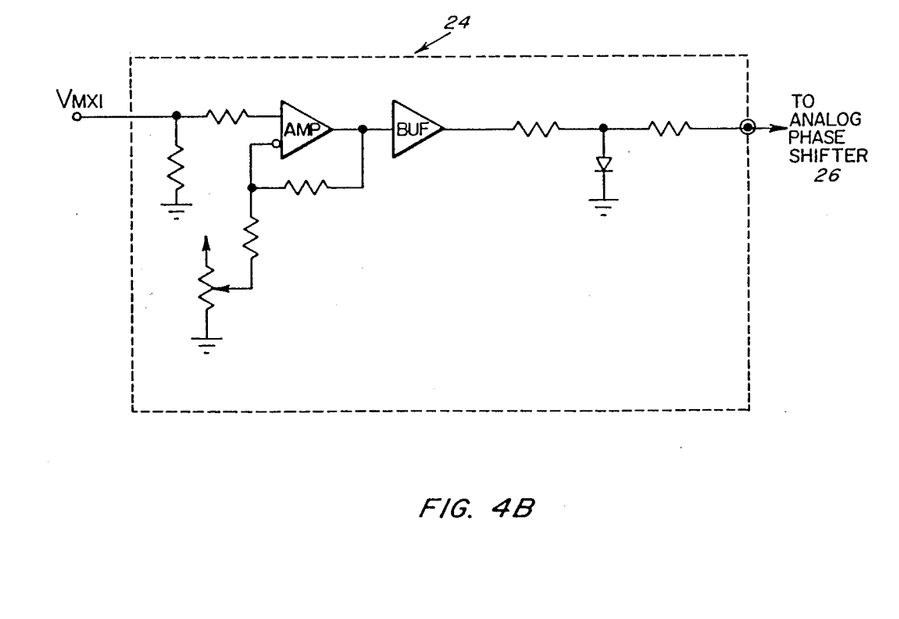
FIG. 4b is a schematic diagram for the analog phase shifter control circuit of FIG. 1.

An exemplary embodiment of analog phase controller 24 is provided in FIG. 4b. As shown therein, the output from mixer 59 ($V_{MX1}$) is input to controller 24, amplified to bring the signal up to levels adequate to drive the analog phase shifter, and preferably is amplified to a sufficient level to place analog phase shifter 26 approximately in the middle of its dynamic range. The amplified signal is then passed through a buffer and clamping diode and is then communicated to analog phase shifter 26.

AM noise reduction circuit 20 is generally illustrated at FIGS. 1 and 2. An exemplary circuit to implement amplitude modulation controller 28 is set forth in more detail at FIG. 3. AM noise reduction circuit 20 is typically a leveling circuit that detects the amplitude modulation in the output of TWT 11, and provides negative feedback to the analog attenuator 29 which, in turn, generates a control signal that regulates the operation of analog attenuator 28.

The output of AM noise detector 27 is AC coupled to AM control 28, such that only the AM noise component, independent of the RF level, is processed by AM noise control 28. Within AM noise control 28, the AM noise is amplified by an amplifier having the necessary gain and bandwidth to generate a signal that may control analog attenuator 29. AM noise control circuit 28 further includes a buffer and current limiting resistor that drive the analog attenuator 29 to a proper level to cancel out the AM noise in the signal from the RF source 13 to TWT 11.

TWT Compensation Circuit

The output of a traveling wave tube generally behaves as a logarithmic function of input as the TWT approaches saturation. When the TWT is in saturation, the input signal to the TWT may vary while the output signal remains at a constant level. This saturation condition is limited to certain ranges of power input. Power input levels greater or less than those falling within a certain range will cause the TWT output to be outside of the saturation region. Consequently, while monitoring the output power provides an indication of whether or not the TWT 11 is in saturation, greater sensitivity is provided by monitoring the differential gain of the TWT, which may vary even while the TWT remains in saturation. Accordingly, the present invention monitors the differential gain of the TWT, and controls the amount of feedback power that is fed back to the input of the TWT in response to the monitored gain.

Figure 6A:
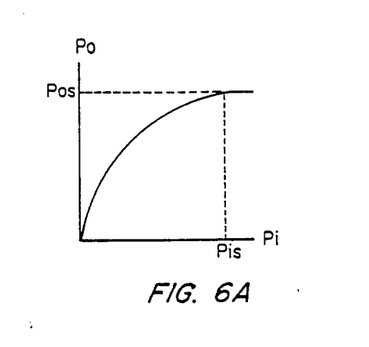
FIG. 6a is a graphical representation of a portion of the TWT gain curve without gain compensation.
Figure 6B:
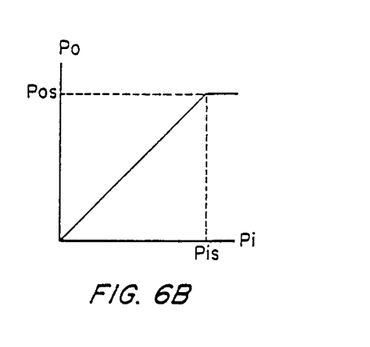
FIG. 6b is a graphical representation of a portion of the TWT gain curve with the inclusion of gain compensation in accordance with the present invention.

FIG. 6A represents the normal TWT gain curve that illustrates an exemplary relationship between the input and output power of TWT 11. FIG. 6b is an idealized or linearized representation of the same relationship. $P_{OS}$ is the saturated output power of the TWT 11, and $P_{IS}$ is the input power required for $P_{OS}$. The present invention compensates for the normal gain characteristics of the TWT so as to increase the feedback power when the gain of the TWT starts to drop off. Thus, the gain curve of the TWT, incorporating the present invention, begins to approach the curve illustrated at FIG. 6B.

FIG. 5 illustrates a portion of the control circuit illustrated at FIG. 1, with further details of an exemplary attenuation control circuit 47. Attenuation control circuit 47 receives inputs from detectors 42 and 44, which sample the input and output signals from TWT 11, respectively. In general, the attenuation control circuit 47 operates to detect and scale down the output of the TWT 11 to approximately the same size as a signal detected from the input of TWT 11. Comparison of the output and input to the TWT provides an indication of the TWT dynamic gain characteristic. The output of the comparison circuit is inverted by a unity gain inverting amplifier, to control the analog attenuation of the positive feedback signal.

The amount of attenuation, accomplished by detector 42 and 44 will determine the gain relationship of the ratio detector and thus control the amount of positive feedback affected by the circuit. In practice, the amount of attenuation affected by detectors 42 and 44 may be predetermined based upon the anticipated operating characteristics of the TWT 11, or may be dithered using well-known techniques such that the amount of positive feedback may be varied until the circuit arrives at the highest possible gain, and then stabilized at the corresponding positive feedback level.

Accordingly, attenuation of the compensation circuit may be preset by reference to TWT specifications, experimental determination, or dithering of the compensation circuit signal levels. Where the attenuation levels are set in accordance with TWT specifications, the attenuation if preferably set to a level corresponding to slightly less than the maximum anticipated gain of the TWT tube. The signals from detectors 42 and 44 are communicated to a ratio detector which generates a signal representative of the gain of TWT in relation to the reference. That signal is then communicated to an operational amplifier that compares the signal to a predetermined level representative of the non-oscillating gain limitation of the feedback loop. Depending upon the relationship between the gain and the predetermined level, the attenuation control circuit 47 communicates a signal to analog attenuator 43, which, along with the digital attenuator 45, controls the attenuation of the positive feedback to the input of TWT 11. Analog attenuator 43 is operated to incrementally vary the attenuation of the portion of the power output signal being fed back to the input of the TWT in response to the attenuation control signal output from attenuation control 47. The amplitude of such incremental variations is dependent upon the gain characteristics of the TWT, and the duration of such increments is dependent upon the loop transit time. Dithering of the attenuation of the TWT gain compensation circuit can take place at different locations in the circuit utilizing technique well known in the art, and permits the present invention to adaptively determine the correct attenuation level to maintain the TWT in saturation despite variation in TWT gain or other operating conditions.

The attenuation control circuit 41 consequently compares signals derived from the input and output of the TWT 11, and uses the resulting gain indication to control the analog attenuator 43 in the positive feedback loop 50. The attenuation control circuit 41 controls the feedback power level to the TWT 11 and maintains the loop gain at less than the unity gain limitation of the feedback loop at all times, i.e., less than a level that induces oscillation in the TWT circuit.

As previously mentioned, the TWT output lags behind the TWT input due to time delay inherent in the TWT itself. Consequently, during each pulse rise time, as TWT output power increases, a TWT gain begins to decrease. Attenuation control circuit 41 senses that transient gain condition via the output of the ratio detector and, in response, must dynamically increase the feedback power level during the pulse rise to provide sufficient RF drive to saturate the TWT. During the trailing edge of the pulse, as output power drops and TWT gain increases, the feedback power level is correspondingly decreased to maintain a non-oscillating condition. Consequently, the present invention permits TWT saturation to be automatically acquired on a pulse-to-pulse basis without external command or control.

In order to accommodate RF pulse rise and fall times of approximately 100 ns, it is anticipated that the attenuation control circuit 41 must have a nominal 10 MHz bandwith. However, to accommodate RF pulse rise and fall times of approximately 50 ns, the attenuation control circuit 41 should preferably have a 20 to 30 MHz bandwidth, with minimum propagation delay.

Moreover, the necessary bandwidth for feedback circuit 50 may also be affected by the overall feedback to incident power ratio for the TWT 11. As previously mentioned, an overall drive level of approximately 40 dBm's may be required for several existing dual mode TWTs. That drive level may be achieved by using a 20 dBm RF source and 20 dBm positive feedback. To achieve this drive augmentation, attenuation control circuit 41 may require a gain bandwidth product of approximately 5 GHz, to maintain gain tracking at better than 1%, which is sufficient to prevent loop oscillation.

Additionally, the attenuation of the TWT RF attributable to the positive feedback circuit must be taken into account because that attenuation will directly affect the desired feedback level. The same care must be excercised in sampling the TWT input. As one skilled in the art will recognize, the feedback circuit 50 is also sensitive to the equivalent length of loop, i.e., the loop transit time, as well as drift in the gain of components in the feedback loop. Thus, the attenuation and phase adjustment circuits should be designed to accommodate those characteristics of the particular implementation.

Phase Control of Feedback

In addition to controlling the loop gain, the phase of the feedback signal must also be controlled to insure that the positive feedback signal is combined in phase with the input RF signal. Such control reduces the phase noise that otherwise would be repetitively amplified by the TWT, resulting in degraded transmitter noise performance. The feedback phase control circuit compares the phases of the input and RF, and RF feedback signals. It then commands a four bit digital phase shifter and an analog phase shifter to vary the phase the RF feedback signal so that it is combined in phase with the RF signal input to provide the drive augmentation to the TWT.

Phase control circuit 31, shown at FIG. 1, operates the phase match the input and feedback signals to the TWT 11. Such phase matching is essential considering the noise impact on the system, and effects the exact power ratio between the input and feedback signals. Phase control circuit 31 includes phase modulation detector 32, analog phase shifter 33, and analog phase sift controller 37, digital phase shifter 35, and digital phase shift controller 39. Phase control circuit 31 is effective to adjust the phase of the positive feedback signal to conform to the phase of the signal from RF source 13 input to the TWT 11. In practice, phase control may be affected by two mixers used in quadrature to permit exact determination of the phase difference between the signals. Limiting amplifiers at the mixer input prevent amplitude variations from distorting the phase difference signal. The mixer outputs drive high-speed ECL III circuits that drive a four bit digital phase shifter and an analog phase shifter to vary the phase of the RF feedback signal, so that it is maintained in phase with the exciter drive signal. The particular technique and circuitry utilized to implement the functions of phase control circuit 31 are matters of design choice and may be identical to that utilized in connection with noise control circuit 21, with the exception that the phase control circuit 31 operates in a positive feedback mode. Consequently, the illustrating and discussions set forth at FIGS. 2, 4a and 4b are also applicable to the structure and operation of phase control circuit 31.

As discussed in connection with noise control circuit 21, the phase control circuit 31 reduces the noise that would otherwise be repetitively amplified by the TWT 11, resulting in degraded transmitter noise performance. The phase control circuit 31 compares the phases of the input and RF feedback signals and commands a four bit digital phase shifter 35 along with an analog phase shifter 33 to vary the phase of the feedback signal so that the feedback signal is combined in phase with the RF input to provide positive drive augmentation to TWT 11.

As previously discussed, various modifications, additions and substitutions may be effected to implement the structure and function of the component portions without departing from the spirit and scope of the invention. For example, other circuitry for effecting gain regulated feedback or augmenting the TWT drive with a portion of the TWT output are anticipated within the scope of the invention. Additionally, it is anticipated that the present invention may have application in various areas beyond radar systems.

What is claimed is:

1. A method for controlling the operation of a traveling wave tube comprising:
   detecting the input signal to the traveling wave tube;
   detecting the output signal from the traveling wave tube;
   comparing said detected input and output signals to generate a first feedback loop attenuation control signal, said control signal being representative of the gain of the traveling wave tube;
   feeding back a portion of the output signal to the input of the traveling wave tube; and
   regulating a signal being fed back from the output to the input of the traveling wave tube in response to said attenuation control signal.

2. The method as recited in claim 1 wherein the step of detecting the input signal to the traveling wave tube comprises detecting the power input to the traveling wave tube.

3. The method as recited in claim 1 wherein the step of detecting the output signal from the traveling wave tube comprises detecting the power output from the traveling wave tube.

4. The method as recited in claim 1 wherein the step of feeding back a portion of the output signal comprises the step of providing positive feedback of a first portion of the power output of the traveling wave tube to the input of the traveling wave tube.

5. The method as recited in claim 1 wherein the step of regulating the fed back signal comprises the step of dynamically varying the feedback to the input of the traveling wave tube in response to the instantaneous gain of the traveling wave tube.

6. A method of augmenting the drive from an exciter source to induce a traveling wave tube to drive itself into saturation, comprising:
   determining when the traveling wave tube is operating on a non-saturated condition;
   feeding back a portion of the traveling wave tube output power to the traveling wave tube input to augment traveling wave tube input power; and
   regulating the portion of the traveling wave tube output power being fed back to the traveling wave tube input in response to the operating condition of the traveling wave tube to drive the traveling wave tube into a saturated operating condition.

7. The method as recited in claim 6 wherein said step of determining whether the traveling wave tube is in a non-saturated condition comprises:
   detecting the input to the traveling wave tube;
   detecting the output from the traveling wave tube; and
   comparing said detected input and output of the traveling wave tube to determine the gain of the traveling wave tube.

8. The method as recited in claim 6 wherein the step of determining whether the traveling wave tube is operating in a non-saturated condition comprises detecting the input and output power of the traveling wave tube.

9. The method as recited in claim 6 wherein the step of feeding back a portion of the traveling wave tube output comprises tapping a portion of the traveling wave tube output power and providing positive feedback of the tapped portion to the input of the traveling wave tube.

10. The method as recited in claim 6 wherein said step of regulating the fed back portion comprises variably attenuating the fed back portion in response to the output of the traveling wave tube.

11. The method as recited in claim 6 wherein said step of regulating the fed back portion further comprises variably attenuating the fed back portion in response to the dynamic gain of the traveling wave tube.

12. The method as recited in claim 6 wherein said step of regulating the fed back portion further comprises variably attenuating the fed back portion in response to the particular output power mode of operation of the traveling wave tube.

13. The method as recited in claim 6, wherein the step of regulating the fed back portion comprises the step of adaptively determining the correct attenuation of the fed back portion to maintain the traveling wave tube in saturation.

14. The method as recited in claim 6 wherein the step of regulating the fed back portion comprises the step of incrementally varying the attenuation of the power output being fed back to the traveling wave tube input in response to said attenuation control signal.

15. The method as recited in claim 6 wherein the step of regulating the fed back portion comprises the step of limiting the gain of the feedback loop to less than unity.

16. The method as recited in claim 6 wherein the step of regulating the fed back portion comprises the step of adjusting the phase of the fed back portion so as to substantially conform the phase of the fed back portion to the phase of the input signal to the traveling wave tube.

17. The method as recited in claim 6 wherein said step of regulating the fed back portion comprises regulating the fed back portion in response to changes in the frequency of the input signal to the traveling wave tube.

18. The method as recited in claim 6 wherein said step of regulating the fed back portion comprises regulating the fed back portion in response to changes in the amplitude of the input signal to the traveling wave tube.

19. The method as recited in claim 6 wherein said step of regulating the fed back portion comprises regulating the fed back portion in response to changes in the phase of the input signal to the traveling wave tube.

20. A drive control circuit for regulating feedback from the output to the input of a traveling wave tube comprising:
   a first detector for detecting the input signal level to the traveling wave tube;
   a second detector for detecting the output signal level from the traveling wave tube;
   a comparator circuit for comparing said input and output signal levels and for generating an attenuator control signal responsive to the gain of the traveling wave tube; and
   a feedback circuit connected to the input and output of the traveling wave tube, said feedback circuit including a feedback attenuator circuit for regulating feedback of the traveling wave tube output signal to the traveling wave tube input in response to said attenuator control signal.

21. A drive control circuit for maintaining RF drive saturation of a traveling wave tube comprising:
   a first detector for detecting the input signal level to the traveling wave tube;
   a second detector for detecting the output signal level from the traveling wave tube;
   a comparator circuit for comparing said input and output signal levels and for generating an attenuator control signal responsive to the gain of the traveling wave tube; and
   a feedback circuit connected to the input and output of the traveling wave tube, said feedback circuit including a feedback attenuator circuit for regulating positive feedback of the traveling wave tube output signal to the traveling wave tube input in response to said attenuator control signal so as to drive the traveling wave tube into a saturated operating condition.

22. The circuit as recited in claim 21 wherein said feedback attenuator circuit is operative to regulate attenuation of positive feedback in response to a shift in frequency of the traveling wave tube input signal.

23. The circuit as recited in claim 21 wherein said attenuator circuit is operative to limit the feedback circuit gain to less than unity to prevent oscillation.

24. The circuit as recited in claim 21 wherein said feedback attenuator circuit is operative to regulate attenuation of the feedback in response to changes in voltage applied to the traveling wave tube grid.

25. The circuit as recited in claim 21 wherein said feedback attenuator circuit includes a digital attenuator adapted to vary the attenuation of the feedback signal in response to variation of the traveling wave tube grid voltage.

26. The circuit as recited in claim 21 wherein said feedback circuit further comprises a feedback phase control circuit for adjusting the phase of the positive feedback so as to substantially conform the phase of the positive feedback signal to the phase of the traveling wave tube input signal.

27. A control circuit for regulating feedback from the output to the input of a traveling wave tube so as to augment the traveling wave tube drive from an exciter source, comprising:
   a detection circuit connected to the traveling wave tube for determining whether the traveling wave tube is operating in a saturation condition, said detector circuit being operative to generate an attenuator control signal in response to the operating condition of the traveling wave tube;
   a positive feedback loop connected to the input and output of the traveling wave tube for providing positive feedback of a portion of the traveling wave tube output power to the traveling wave tube input; and
   a feedback attenuator disposed in said feedback loop for regulating said feedback in response to said attenuator control signal so as to drive the traveling wave tube into a saturated operating condition.

28. The apparatus as recited in claim 27 wherein said detection circuit comprises a gain detection circuit connected to the traveling wave tube output and input, said gain detection circuit being operative to generate an attenuation control signal in response to the gain of the traveling wave tube.

* * * * *